United States Patent
Chen et al.

(10) Patent No.: US 6,924,997 B2
(45) Date of Patent: Aug. 2, 2005

(54) FERROELECTRIC MEMORY AND METHOD OF OPERATING SAME

(75) Inventors: Zheng Chen, Colorado Springs, CO (US); Vikram Joshi, Colorado Springs, CO (US); Myoungho Lim, Colorado Springs, CO (US); Carlos A. Paz de Araujo, Colorado Springs, CO (US); Larry D. McMillan, Colorado Springs, CO (US); Yoshihisa Kato, Shiga (JP); Tatsuo Otsuki, Osaka (JP); Yasuhiro Shimada, Kyoto (JP)

(73) Assignees: Symetrix Corporation, Colorado Springs, CO (US); Matsushita Electric Industrial Co., Ltd., Osaka (JP)

( * ) Notice: Subject to any disclaimer, the term of this patent is extended or adjusted under 35 U.S.C. 154(b) by 83 days.

(21) Appl. No.: 10/381,235

(22) PCT Filed: Sep. 25, 2001

(86) PCT No.: PCT/US01/42288

§ 371 (c)(1), (2), (4) Date: Oct. 9, 2003

(87) PCT Pub. No.: WO02/25667

PCT Pub. Date: Mar. 28, 2002

(65) Prior Publication Data

US 2004/0047174 A1 Mar. 11, 2004

Related U.S. Application Data

(60) Provisional application No. 60/235,241, filed on Sep. 25, 2000.

(51) Int. Cl.$^7$ .............................................. G11C 11/22
(52) U.S. Cl. .................................. 365/145; 365/189.01
(58) Field of Search ........................... 365/145, 189.01, 365/117

(56) References Cited

U.S. PATENT DOCUMENTS

| | | | |
|---|---|---|---|
| 4,360,896 A | | 11/1982 | Brody |
| 5,031,143 A | * | 7/1991 | Jaffe .......................... 365/145 |
| 5,903,492 A | * | 5/1999 | Takashima .................. 365/145 |
| 5,966,318 A | | 10/1999 | Ramer et al. |
| 6,151,242 A | | 11/2000 | Takashima .................. 365/145 |
| 6,614,678 B2 | * | 9/2003 | Kato et al. ................... 365/145 |

FOREIGN PATENT DOCUMENTS

| | | |
|---|---|---|
| EP | 1170753 A1 | 1/2002 |
| EP | 1176601 A1 | 1/2002 |

* cited by examiner

Primary Examiner—Thong Q. Le
(74) Attorney, Agent, or Firm—Patton & Boggs LLP

(57) ABSTRACT

A ferroelectric memory 636 includes a group of memory cells (645, 12, 201, 301, 401, 501), each cell having a ferroelectric memory element (44, 218, etc.), a drive line (122, 322, 422, 522 etc.) on which a voltage for writing information to the group of memory cells is placed, a bit line (25, 49, 125, 325, 425, 525, etc.) on which information to be read out of the group of memory cells is placed, a preamplifier (20, 42, 120, 320, 420, etc.) between the memory cells and the bit line, a set switch (14, 114, 314, 414, 514, etc.) connected between the drive line and the memory cells, and a reset switch (16, 116, 316, 416, 516, etc.) connected to the memory cells in parallel with the preamplifier. The memory is read by placing a voltage less than the coercive voltage of the ferroelectric memory element across a memory element. Prior to reading, noise from the group of cells is discharged by grounding both electrodes of the ferroelectric memory element.

12 Claims, 7 Drawing Sheets

FERROELECTRIC MEMORY AND METHOD OF OPERATING SAME

This application is a National Phase filing in the United States of International Patent Application No. PCT/US01/42288 filed Sep. 25, 2001, which is a PCT filing of and claims priorty to U.S. Provisional Application No. 60/235,241 filed Sep. 25, 2000.

BACKGROUND OF THE INVENTION

1. Field of the Invention

This invention relates to ferroelectric memories, and more particularly to such a memory and method of operation that has very low fatigue, can be used in a non-destructive read mode, and eliminates disturb problems.

2. Statement of the Problem

It has been known since at least the 1950's that if a practical ferroelectric memory could be made, it would provide a fast, dense, non-volatile memory that could be operated at relatively low voltages. See Orlando Auciello et al., "The Physics of Ferroelectric Memories", *Physics Today*, July 1998, pp. 22–27. The principal type of ferroelectric memory being explored today is the non-volatile ferroelectric random access memory or NVFRAM. Ibid. A disadvantage of the NVFRAM is that, in the process of reading it, the information it holds is destroyed and, therefore, the read function must be followed by a rewrite function. However, it has been postulated for at least 40 years that it may be possible to design a memory in which the memory element is a ferroelectric field effect transistor (FET), which memory could be non-destructively read. See Shu-Yau Wu, "A New Ferroelectric Memory Device, Metal-Ferroelectric-Semiconductor Transistor", *IEEE Transactions On Electron Devices*, pp. 499–504, August 1974; S. Y. Wu, "Memory Retention and Switching Behavior Of Metal-Ferroelectric-Semiconductor Transistors", *Ferroelectrics*, Vol. 11, pp. 379–383, 1976; and J. R. Scott, C. A. Paz de Araujo, and L. D. McMillan, "Integrated Ferroelectrics", *Condensed Matter News*, Vol. 1, No. 3, pp. 15–20, 1992. Because the ferroelectric memory effect measured in the early devices of Wu was only a temporary, single state effect rather than a long-lived two-state effect, it is now believed that this effect was charge injection effect rather than an effect due to ferroelectric switching. However, a metal-ferroelectric-insulator-semiconductor FET device, i.e. a MFISFET, has recently been reported that appears to show true ferroelectric memory behavior. See Tadahiko Hirai, et al., "Formation of Metal/Ferroelectric/Insulator/Semiconductor Structure With A $CeO_2$ Buffer Layer", *Japan Journal of Applied Physics*, Vol. 33, Part I, No. 9B, pp. 5219–5222, September 1994; Tadahiko Hirai et al., "Characterization of Metal/Ferroelectric/Insulator/Semiconductor Structure With A $CeO_2$ Buffer Layer", *Japan Journal of Applied Physics*, Vol. 34, Part I, No. 8A, pp. 4163–4166, August 1995; Yong Tae Kim et al., "Memory Window of $Pt/SrBi_2Ta_2O_9/CeO_2/SiO_2/Si$ Structure For Metal Ferroelectric Insulator Semiconductor Field Effect Transistor", *Applied Physics Letters*, Vol. 71 No. 24, pp. 3507–3509, 15 December 1997; and U.S. Pat. No. 5,744,374 issued Apr. 28, 1998 to Jong Moon.

To make a memory requires not only a memory element, but also a means for addressing a large number of memory elements. Initially, it was believed that a ferroelectric memory element might be addressed by a simple array of rows and columns of conductors. A ferroelectric memory element, it was thought, could be located at each of the junctures of the array and addressed by applying a voltage to the conductors for the corresponding row and column. It was believed that if the voltage on each conductor was less than the threshold voltage for ferroelectric switching (coercive voltage) and the voltage difference between the conductors was greater than the coercive voltage, then only the selected cell would be written to or read, and the other cells would remain unchanged. However, it was found that this did not work because the neighboring unselected cells were disturbed by the voltages on the address lines. Thus, a switch was added between one of the address lines and each ferroelectric memory element. See U.S. Pat. No. 2,876,436 issued Mar. 3, 1959 to J. R. Anderson and U.S. Pat. No. 4,873,664 issued Oct. 10, 1989 to S. Sheffield Eaton, Jr. If the switch is a transistor as in the latter patent, the memory assumes a memory address architecture essentially the same as that of a conventional DRAM. However, when applied to a ferroelectric memory, even this architecture disturbed the memory cells attached to the same plate line as the addressed cell. That is, it has been found that ferroelectric materials do not have a sharp coercive threshold voltage, but rather even a small voltage will cause the ferroelectric to partially switch and, therefore, the repetitive application of small disturb voltages, such as occur in a conventional memory array, eventually causes the change or loss of a memory state. Therefore, a more complex architecture was proposed to overcome this disturb. See, for example, U.S. Pat. No. 4,888,733 issued Dec. 19, 1989 to Kenneth J. Mobley.

The above address schemes are all for a NVFRAM; that is, a memory utilizing a ferroelectric capacitor as a memory element, rather than for a memory utilizing a ferroelectric FET. A number of address architectures have been disclosed up to now for a memory in which the memory element is a ferroelectric FET. U.S. Pat. No. 5,523,964 issued Jun. 4, 1996 to McMillan et al. discloses a relatively complex addressing architecture, utilizing five transistors in each memory cell in addition to the ferroelectric FET. This complexity is incorporated, like the Mobley et al. architecture, to avoid the disturb problem. Such complex architecture results in a memory that is much less dense and slower than, for example, a conventional DRAM. An architecture that uses one ferroelectric FET per memory cell has been proposed, but has not been implemented because it cannot be read properly if three neighboring cells all are in the conducting logic state. See U.S. Pat. No. 5,449,935 issued to Takashi Nakamura on Sep. 12, 1995, column 3, line 56—column 4, line 15. Another such one-FET-per-memory cell design has been proposed in U.S. Pat. No. 5,768,185 issued to Takashi Nakamura and Yuichi Nakao on Jun. 16, 1998. However, during reading a voltage of 3 volts to 5 volts is applied to the word line while the ground or zero volts is applied to the bit line. While this is not enough to switch the ferroelectric in a single read cycle, as indicated above, it is now known that successive pulses of this magnitude, such as occur in a memory in the normal process of reading, can disturb the ferroelectric state. In addition, since the bit line is connected to the source and substrate and the word line is connected to the gate, if the WLn and BLm+1 signals are not exactly synchronized, the erase process of one cell will disturb the next. Under manufacturing specifications that are practically feasible, such exact synchronization is difficult to achieve in all cells. Therefore, in a commercial product there will be short disturb voltages during the erase cycle also. Further, with this architecture, it is not possible to write a byte at a time, which is a much faster way of reading in a ferroelectric FET. Thus, it appears that the fact that the ferroelectric material does not have a sharp coercive field threshold and can be switched by repetitive applications of a voltage somewhat less than the coercive voltage has made several of the original objectives of research into ferroelectric memories unattainable. It would, therefore, be highly desirable to provide an architecture and method for addressing a ferroelectric memory, particularly a ferroelectric FET structure and method of making the structure, that was relatively simple and, at the same time, avoided the problems in the prior art, such as the disturb problem.

SUMMARY OF THE INVENTION

The invention solves the above problem by providing a method and apparatus for addressing a ferroelectric memory in which fatigue and disturb are insignificant. Commercial forms of the memory can easily operate without fatigue or disturbance for ten years or more. The invention does this by combining a set and reset switch with a group of memory cells, such as a column or row. Preferably, the invention also utilizes the combination of a read voltage that is less than the coercive voltage with a preamplifier associated with each group of cells. Preferably, the read voltage is less than half the coercive voltage, and in some cases is less than a third of the coercive voltage.

The invention provides a ferroelectric memory comprising a memory cell and a circuit for reading and writing to the memory cell, wherein the circuit for reading and writing includes a drive line on which a voltage for writing information to the memory cell is placed, a bit line on which information to be read out of the memory cell is placed, a preamplifier between the memory cell and the bit line, a set switch connected between the drive line and the memory cell, and a reset switch connected to the memory cell. Preferably, the preamplifier comprises a transistor having a gate and a pair of source-drains, and wherein the memory cell is connected to the gate, and one of the source-drains is connected to the bit line. Preferably, the reset switch is a transistor having a pair of reset source-drains, with one of the reset source-drains connected to the memory cell and the other of the reset source-drains connected to one of the source-drains of the preamplifier transistor. Preferably, set switch is a transistor having a pair of set source-drains, with one of the set source-drains connected to the memory cell and the other of the set source-drains connected to the drive line. Preferably, the reset switch is a transistor having a pair of reset source-drains, with one of the reset source-drains connected to the memory cell and the other of the reset source-drains connected to the bit line. Preferably, the reset switch is connected in parallel with the preamplifier between the memory cell and the bit line.

In another aspect, the invention provides a ferroelectric memory comprising a memory cell and a circuit for reading and writing to the memory cell, wherein the circuit for reading and writing includes a drive line on which a voltage for writing information to the memory cell is placed, a bit line on which information to be read out of the memory cell is placed, a preamplifier between the memory cell and the bit line, a set switch connected between the drive line and the memory cell, and a reset switch connected in parallel with the preamplifier between the memory cell and the bit line. Preferably, the preamplifier comprises a transistor having a gate and a pair of source-drains, and wherein the memory cell is connected to the gate, and one of the source-drains is connected to the bit line. Preferably, the set switch is a transistor having a pair of set source-drains, with one of the set source-drains connected to the memory cell and the other of the set source-drains connected to the drive line. Preferably, the reset switch is a transistor having a pair of reset source-drains, with one of the reset source-drains connected to the memory cell and the other of the reset source-drains connected to the bit line.

Preferably, each of the ferroelectric memories herein described can be implemented either as a non-destructive read out memory or a destructive read out memory.

The invention also provides a method of reading a ferroelectric memory, the memory including: a memory cell including a ferroelectric memory element having a coercive voltage, and a conducting line connected to the memory cell, the method comprising the steps of: placing a voltage across the ferroelectric memory element, the voltage being less than the coercive voltage; and sensing a voltage on the conducting line. Preferably, the voltage ranges from 0.1 to 0.5 volts, and most preferably, from 0.1 to 0.3 volts. Preferably, the voltage is one-half of the coercive voltage or less. In some designs, the voltage is one-third of the coercive voltage or less. Preferably, the memory includes a group of memory cells connected to the conducting line and further including a reset step comprising discharging noise from the group of memory cells. Preferably, each of the memory elements comprises a ferroelectric capacitor and the reset step comprises grounding both sides of each of the ferroelectric capacitors in the group of memory cells.

In a further aspect, the invention provides a method of reading a ferroelectric memory, the memory including: a memory cell including a ferroelectric memory element and a conducting line connected to the memory cell, the method comprising the steps of: placing a first voltage across the ferroelectric memory element to develop a read voltage on the conducting line; preamplifying the read voltage to produce a preamplified voltage or current on a bit line; and sensing the preamplified voltage or current on the bit line. Preferably, the first voltage ranges from 0.1 to 0.5 volts. Most preferably, the first voltage ranges from 0.1 to 0.3 volts. Preferably, the first voltage is one-half or less of the coercive voltage of the ferroelectric memory element. In some designs, the first voltage is one-third or less of the coercive voltage of the ferroelectric memory element.

The invention further provides a method of discharging noise from a ferroelectric memory, the memory including a group of memory cells, each memory cell including a ferroelectric capacitor, the method comprising grounding both sides of each of the ferroelectric capacitors.

The invention not only provides a ferroelectric memory in which one cell is not disturbed when another cell is written to or read and can be read non-destructively, but also is simpler and much more dense than state-of-the-art commercial ferroelectric memories. Numerous other features, objects and advantages of the invention will become apparent from the following description when read in conjunction with the accompanying drawings.

DETAILED DESCRIPTION OF THE PREFERRED EMBODIMENT

1. Introduction

Figure 1:
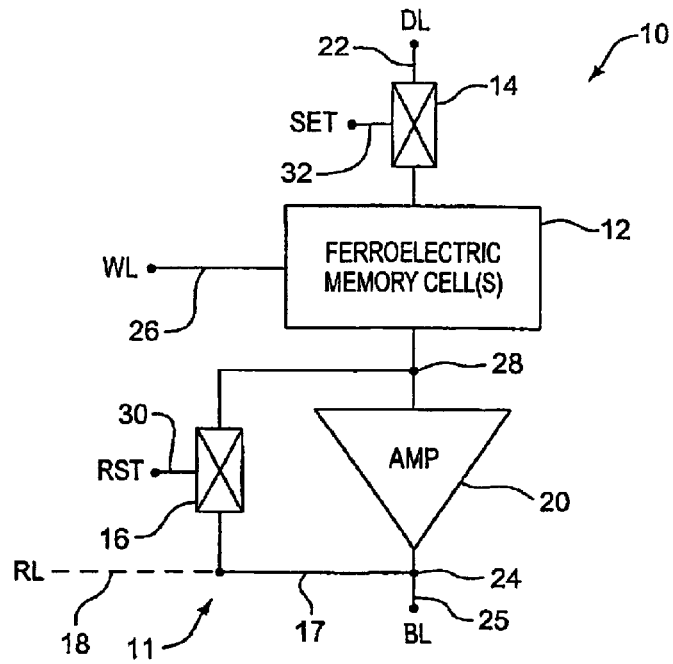
FIG. 1 shows an electrical schematic diagram of a preferred embodiment of a ferroelectric memory according to the invention.

FIG. 1 shows a general structure of a ferroelectric memory array system 10 according to this invention. Array system 10 includes memory cell or cells 12, set switch 14, reset switch 16, and preamplifier 20. Memory cell group 12 is preferably a ferroelectric plurality of memory cells, but may be a single cell. The cell may be any ferroelectric cell, and examples are given below. Reset switch 16 and preamplifier 20 are connected in parallel between bit line node 24 and memory cell/preamplifier node 28. Set switch 14 is connected in series between drive line 22 and memory cell group 12. Switches 14 and 16 are controlled by the SET and RST signals on lines 32 and 30, respectively.

As will be understood more fully after reading the description below, in this disclosure, the term "preamplify" or "amplify" includes increasing a voltage to permit it to be read more easily, increasing a current so that it can be read more easily, changing a voltage that can not be easily read to a current that can be more easily read, and changing a current that can not be easily read to a voltage that can be more easily read.

The dashed line 18 carrying the signal RL illustrates an alternative arrangement of the signals applied to reset switch 16 and preamplifier 20. In this alternative arrangement, line 17 between the bit line and the reset switch 16 is eliminated and replaced by line 18. In this arrangement, the preamplifier 20 would have an internal connection to ground that is not explicitly shown, or could also be connected to the RL signal. This arrangement is a little more complex since it requires another signal, RL, but it permits separating the signals for the reading and writing functions, which adds a degree of control on robustness to the circuit.

In the preferred arrangement, digital "1" and "0" states are written via drive line 22 and bit line 25 on which the signals DL and BL, respectively, are placed. Data is read via bit line 25, with a low operation voltage applied on drive line 22. Alternatively, data may be read via drive line 22 with a low operation voltage applied on bit line 25. A signal WL is applied to memory cell array 12 via a word line 26 to select the memory cell to be written to or read. Table 1 shows the truth table of write and read operations. During writing operation, switches 14 and 16 are both ON. Data "1" is programmed by applying a high voltage, on DL, while BL is grounded. The high voltage is a voltage greater than the coercive voltage, Vc, of the ferroelectric memory element in cell(s) 12. Data "0" is programmed by applying a high voltage on BL, while DL is grounded.

TABLE 1

Truth Table of Write/Read Operations

|  | DL | BL | Set Switch | Reset Switch |
|---|---|---|---|---|
| Write "1" | 1 | 0 | ON | ON |
| Write "0" | 0 | 1 | ON | ON |
| Read | A low voltage | Sensing | ON | OFF |

Figure 2:
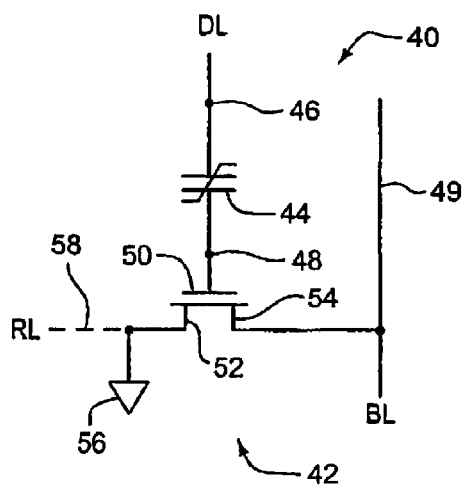
FIG. 2 is an equivalent circuit diagram of the ferroelectric memory of FIG. 1 during a NDRO operation.

During the reading operation, the set switch 14 is ON while the reset switch 16 is OFF. Therefore, the selected cell is equivalent to the circuit shown in FIG. 2. As illustrated In FIG. 2, a transistor 42 is preferably used as a preamplifier and a ferroelectric capacitor 44 is preferably used as the ferroelectric element. Transistor 42 may be called a "read transistor" since it is used in the reading operation. It is preferably a MOSFET. In this embodiment, during the read operation, one electrode of capacitor 44 is equivalently connected to the drive line node 46, and the other electrode is equivalently connected to the memory cell/preamplifier node 48, which is also connected to the gate 50 of transistor 42. One source-drain 54 of transistor 42 is equivalently connected to the bit line 49, while the other source-drain 52 is equivalently connected to low voltage, indicated as a ground 56.

The reading and writing functions for the alternative arrangement using line 18 and the signal RL are the same, except that the RL signal replaces the BL signal in the write function. In this alternative arrangement, the other source-drain 52 is connected to the RL signal, which would be set to low or ground during the reading operation.

A relatively low DL voltage is applied to drive line node 46 during reading, which voltage is used to differentiate the status of the ferroelectric capacitor 44. The voltage across the ferroelectric capacitor 44 can be found by:

$$V_1 = V_f + V_{MOS} \quad \text{(Equation 1)}$$

$$C_f V_f = C_{MOS} V_{MOS} \quad \text{(Equation 2)}$$

where $V_1$ is the voltage applied on node 46; $V_f$ is the voltage across the ferroelectric capacitor, $V_{MOS}$ is the voltage on node 48 or the gate 50 of transistor 42; $C_f$ is the ferroelectric capacitance; and $C_{MOS}$ is the total MOS capacitance of transistor 42 from gate to substrate. Therefore, the $C_f$ and $C_{MOS}$ ratio plays an important role in this circuit. The voltage on node 46, $V_1$ and this ratio must ensure that the voltage dropped across the ferroelectric capacitor, or $V_f$, is not high enough to disturb the ferroelectric status.

The read voltage DL is preferably 0.5 to 3.0 volts, and most preferably 0.7 to 2.6 volts. As an example, say 1.2 V is applied to drive line node 46. A proper $C_f$ and $C_{MOS}$ ratio is chosen so that only 0.1 V to 0.3 V drops across the ferroelectric capacitor. This small positive voltage is well below the coercive voltage and is not enough to disturb the "0" state of the ferroelectric capacitor. Because of the different ferroelectric capacitance between the "1" state and the "0" state, a different voltage, $V_{MOS}$, will develop on the gate of the read transistor 42 if the ferroelectric capacitor 44 is in the "1" state than if the ferroelectric capacitor is in the "0" state. Preferably, a voltage between 0.1 V and 1.0 V is applied to bit line 49, and typically this voltage is 0.5 V. The voltage difference between ground 56 and bit line 49 causes a drain to source current to flow through transistor 42, which current will be different depending on the voltage on gate 50. Thus, the small voltage differences in the gate voltage between the "0" and "1" states results in different drain to source currents, which are read by conventional sense amplifier circuitry of the memory.

Figure 3:
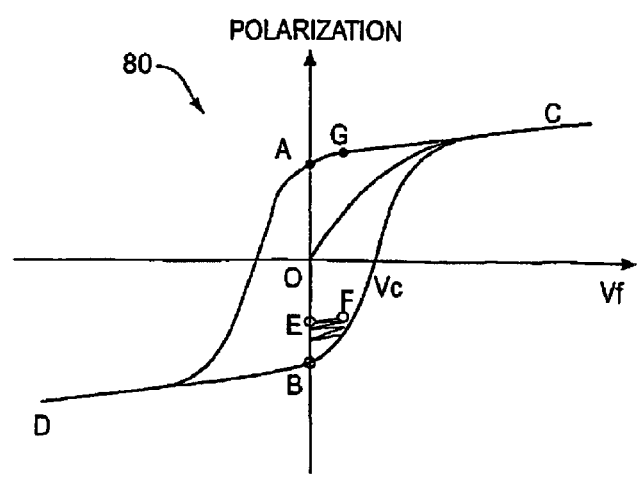
FIG. 3 illustrates a graph of the polarization versus voltage, i.e., the hysteresis loop for a memory according to the invention during the NDRO read operation.

If the cell is programmed with data "0", the ferroelectric is in state B as shown in FIG. 3. During reading operation, a positive voltage drops across the ferroelectric, and its value can be determined by Equations (1) and (2). If this positive voltage is lower than the coercive voltage, it could destroy part of the negative polarization, but will not switch the polarization. As shown in FIG. 3, state B would increase with the positive pulses of multiple reading cycles, but it will stop at some point E which depends on how much voltage is applied and the number of cycles applied. Therefore, in general, for reading data "0" operation and a voltage DL between 0.5 to 3.0 volts, the polarization changes between state E and state F.

If the cell is programmed with data "1", the ferroelectric is in state A as shown in FIG. 3. A positive reading voltage will not disturb this positive polarization at all. Therefore, for reading data "1" operation, the polarization changes between state A and state G.

Returning to Equations (1) and (2), to differentiate data "1" and "0", a different $C_f$ is required for the two states. $C_f$ is the ferroelectric capacitance, or approximately $dP/dV_f$, which is the slope of the polarization. Therefore, the difference between the slope of the AG curve and the slope of the EF curve in FIG. 3 is used to differentiate data "1" and "0". Usually the slope of AG is smaller than that of EF, which means $C_f$ of data "1" is smaller than $C_f$ of data "0". The difference of $C_f$ can be sensed by either voltage or current sense.

Because each time the ferroelectric element is read, only a small voltage is applied to the ferroelectric film, and the ferroelectric will not switch. Therefore, this invention eliminates the fatigue problem, if we assume that the number of reading cycles is much greater than the number of writing cycles, which is true for most memory applications.

This invention can also be used as destructive read out memory if a high voltage is applied to drive node 46 during the reading operation. In this case, for the "0" state, the polarization may return back to the origin "0" or state A as shown in FIG. 3. A writing back procedure should be followed after each read. Using a destructive read out operation, the noise margin can be improved.

2. Detailed Architectures

Figure 4:
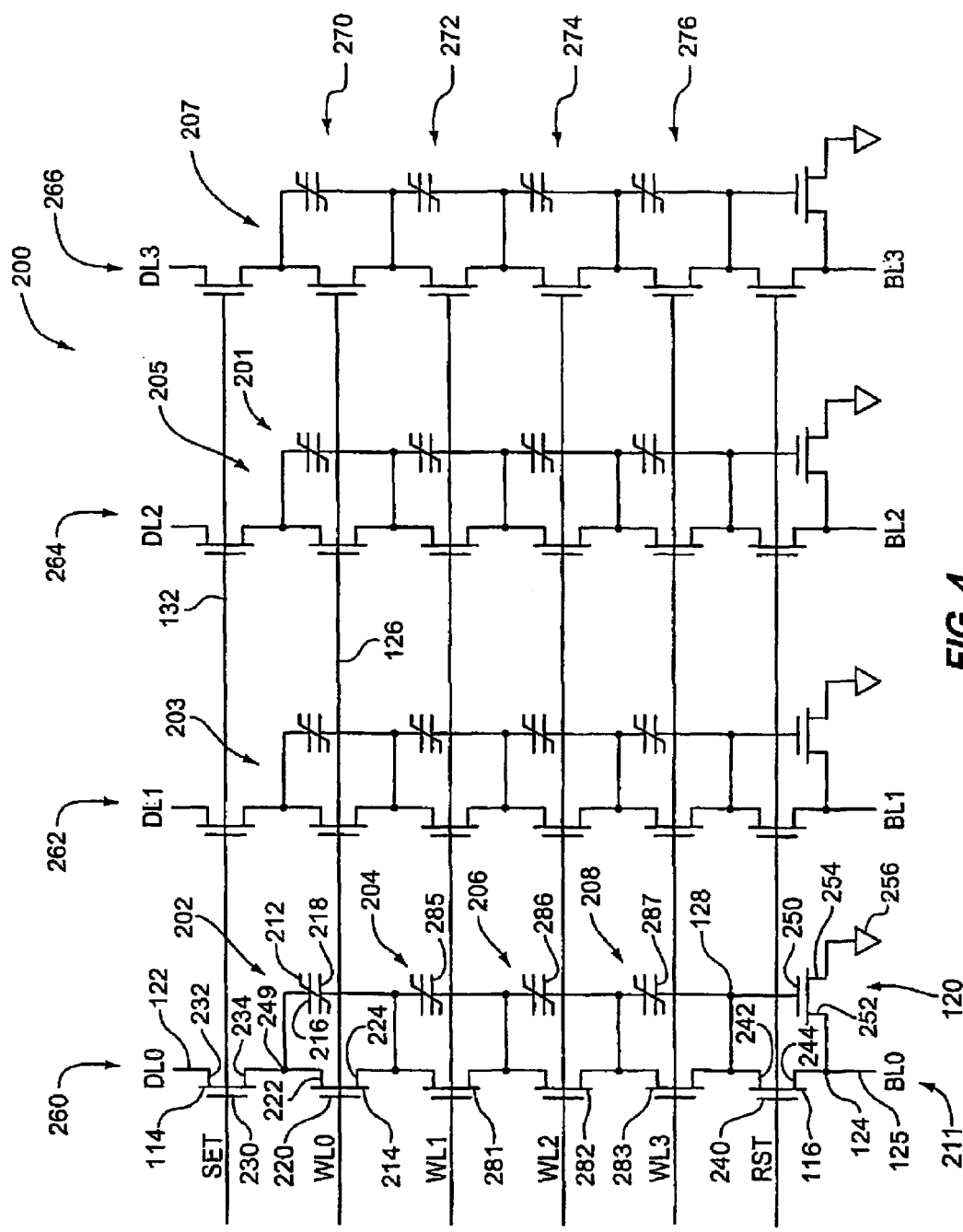
FIG. 4 is a circuit diagram of a preferred architecture of an NDRO ferroelectric memory according to the invention.

FIGS. 4–7 illustrate the invention as used in combination with various memory cell architectures. FIG. 4 illustrates the preferred embodiment of the invention utilizing a chain cell architecture. In this embodiment, a 4×4 cellular array 201 is shown. That is, there are four columns 260, 262, 264, and 266 of cells and four rows 270, 272, 274, and 276 of cells. For example, column 260 comprises cells 202, 204, 206, and 208, while row 270 comprises cells 202, 203, 205, and 207. Each cell, such as 202, includes a transistor, such as 214, and a capacitor, such as 212. In each cell, the transistor is connected in parallel with the capacitor. That is, one source-drain 222 of transistor 214 is connected to one electrode 216 of capacitor 212, while the other source-drain 224 is connected to the other electrode 218 of capacitor 212. The gate 220 of transistor 214 is connected to the word line 126. The cells, such as 202, 204, 206, and 208 of a column, such as 260, are connected in series, hence the name "chain cell". In this architecture, the transistors of neighboring cells in the change are connected source to drain and the capacitors of neighboring cells are connected electrode to electrode. The cell 202 at the end nearest the drive line 122 is connected to one source-drain 234 of set transistor 114, while the other source-drain 232 is connected to the drive line 122. The gate 230 of set transistor 114 is connected to the set signal line 132. The cell 208 at the end closest to bit line 125 is connected to the gate 250 of amplifying transistor 120, and the reset transistor 116 is connected across the preamplifier 120, with one source-drain 242 connected to the gate 250 and the other source-drain 244 connected to the source-drain 252 of amplifying transistor 120 that is connected to the bit line 125. The other source-drain 254 of amplifying transistor 120 is connected to ground 256. The operation of the memory array system 200 is the same as that described above with respect to FIG. 1, with node 124 in FIG. 4 corresponding to node 24 in FIG. 1, node 128 in FIG. 4 corresponding to node 28 in FIG. 1, set transistor 114 of FIG. 4 corresponding to set switch 14 of FIG. 1, reset transistor 116 of FIG. 4 corresponding to reset switch 16 of FIG. 1, and amplifying transistor 120 of FIG. 4 corresponding to preamplifier 20 of FIG. 1. The only additional factor that must be considered is that the word line, such as 126, of the row of the selected cells are held low to hold the transistor, such as 214, of the selected cell off, while the word lines of the non-selected cells are held high to turn the corresponding transistors on and short out the corresponding capacitor. The set transistor, such as 114, of the selected column, such as 260, is on while the other set transistors of the non-selected columns are off.

In the chain cell architecture, the cells are connected in series, which reduces the internal connections to a minimum and therefore reduces the cell size. With a longer chain of cells, the average cell size becomes even smaller.

Table 2 is a truth table for writing and reading cell 10, that is the cell in row "1" and column "0", i.e., cell 204. Since the zeroth column is selected, DL1, DL2, DL3, BL1, BL2, and BL3 are all low or at zero voltage, and do not change. In this table, WL1 is the word line signal for the cells in row "1", WLx is the word line signal for the xth row, DL0 and BL0 are the drive line and bit line signals, respectively, for the zeroth column, and SET0 and RST0 are the SET and RST signals, respectively, for the zeroth column. To select a certain cell, the signal WL applied to its word line must be a low voltage, assuming all transistors are NMOS, to turn off its cell transistor, while all other WLs must be high. For example, to write or read Cell 10, WL1 must be low to turn off the transistors in that row, while WL0, WL2 and WL3 are all high so that the transistors in the corresponding rows are on, which shorts the nodes between the transistors. In such a case, all the voltage between the nodes 249 and 128 will drop across the selected cell 204, and the other three ferroelectric capacitors are all shorted; that is, there is no voltage drop across those three capacitors.

TABLE 2

Truth Table of Write/Read Cell 10 of Chain Cell

| | WL1 | WLx | DL0 | BL0 | SET0 | RST0 |
|---|---|---|---|---|---|---|
| Write "1" | 0 | 1 | 1 | 0 | 1 | 1 |
| Write "0" | 0 | 1 | 0 | 1 | 1 | 1 |
| Read | 0 | 1 | Low Voltage | 0 | 1 | 0 |

To write "1" to cell 10, DL0 is set to the digital "1" state, which is about three volts, and BL0 is set at low or zero volts. SET0 and RST0 are both at the digital "1" state, approximately 3 volts, turning on transistors 114 and 116, so that 3 V is applied to node 249 while node 128 is grounded. Because transistors 214, 282, and 283 are all turned on by applying 3 V to WL0, WL2 and WL3 while transistor 281 is off by applying 0 V to WL1, the 3 V between node 249 and node 128 goes directly to the top electrode and bottom electrode of the ferroelectric capacitor 285, or a data "1" is written into capacitor 285. If the coercive voltage of the ferroelectric capacitor is about 1 V, 3 V is enough to switch the ferroelectric.

Writing "0" is very similar to writing "1", except that SET0 is 0 V while RST0 is 3 V.

To read cell 10, the "1" row is selected by applying a low WL signal turning off transistor 281, while keeping all other word line signals WLx high to turn transistors 214, 282, and 283 on. SET0 is high to turn on set transistor 114, which lets a low voltage of about 0.5 V applied on DL0 go through to the chained cells. Because transistor 281 is off while transistors 214, 282 and 283 are all on, the voltage applied on DL0 will go to capacitor 285, and capacitors 218, 286, and 287 are shorted. The voltage applied to capacitor 285 causes a voltage to be applied to node 128 as described above with respect to FIGS. 2 and 3, which voltage is sensed and converted to current by transistor 120 and read via the bit line.

Figure 5:
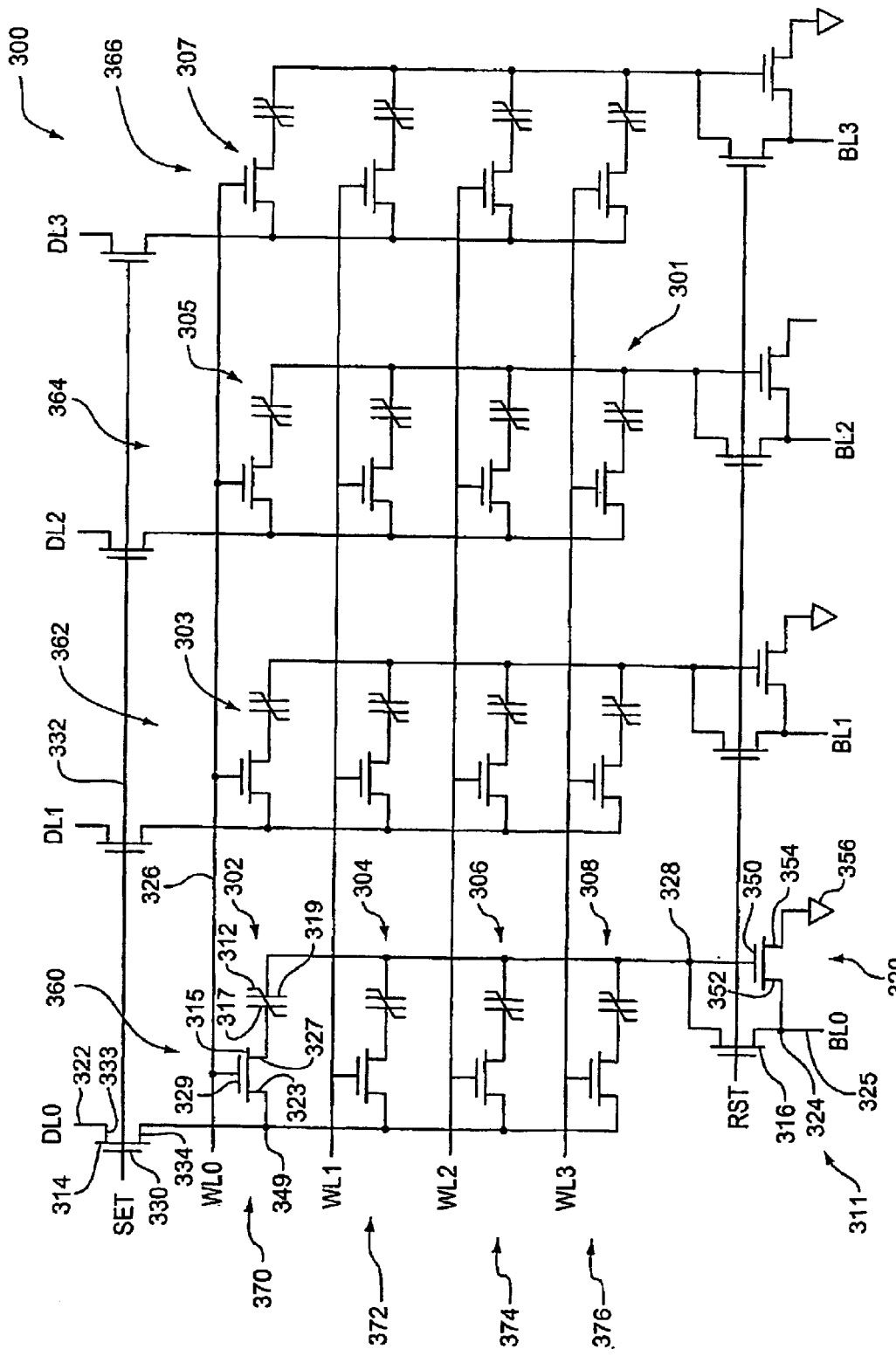
FIG. 5 is a circuit diagram of an alternative preferred architecture of an NDRO ferroelectric memory according to the invention.

FIG. 5 illustrates a 4×4 link cell architecture. This architecture is similar to that of the chain cell architecture of FIG. 4 except that the transistor and ferroelectric capacitor in each cell are connected in series and the cells in each column are connected in parallel. For example, in cell 302 gate 329 of transistor 315 is connected to word line 326, one source-drain 323 is connected to node 349 and the other source-drain 327 is connected to one electrode 317 of capacitor 312. The other electrode 319 of capacitor 312 is connected to node 328. SET switch 314 is a transistor having its gate 330 connected to SET line 332, one source-drain 333 connected to drive line 322, and the other source-drain 334 connected to node 349. Similarly, reset switch 316 is a transistor 316 connected between bit line node 324 and node 328 as previously described with respect to FIGS. 1 and 4, and preamplifier 320 is a transistor 320 with its gate 350 connected to node 328, one source-drain 352 connected to bit line 325 and the other source-drain 354 connected to ground 356. Again, array system 300 has a cellular array 301 comprising four rows 370, 372, 374, and 376 and four columns 360, 362, 364, and 366 of memory cells. For example, column 360 includes cells 302, 304, 306, and 308, and row 370 includes cells 302, 303, 305, and 307.

The operation of the linked cell structure of FIG. 5 is similar to that of the chain cell structure of FIG. 4, except that in this architecture the selected word line signal, such as WL0, is high, turning on the selected transistor, such as 315, while the word line signals of the non-selected rows are low, turning off the corresponding transistor.

Figure 6:
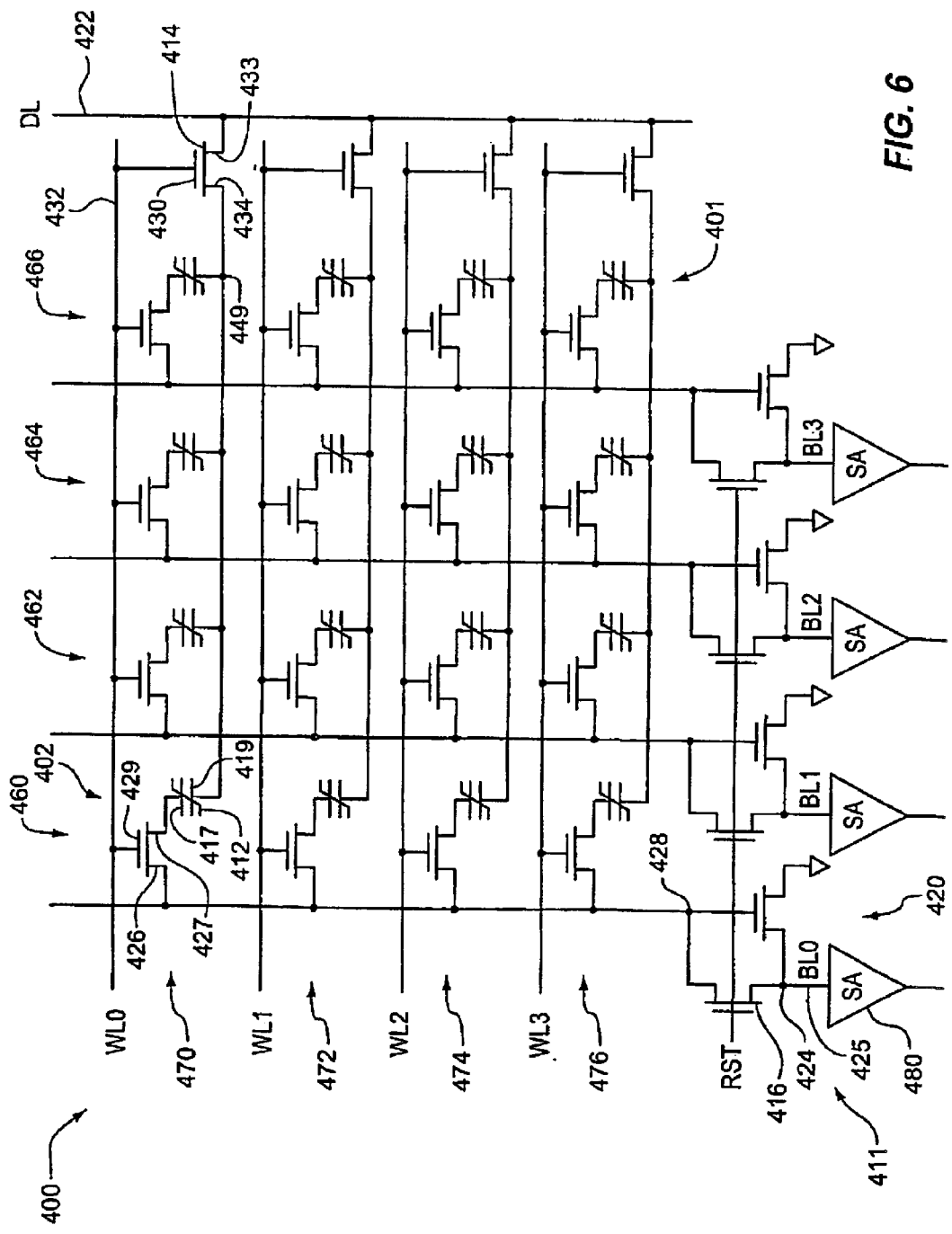
FIG. 6 is a circuit diagram of another alternative architecture of an NDRO ferroelectric memory according to the invention.

FIG. 6 shows an implementation of an array system 400 in which the basic memory cell, such as 402, has one transistor, such as 415, and one capacitor, such as 412, connected in series. One source-drain 426 of transistor 415 is connected to node 428, while the other source drain 427 is connected to one electrode 417 of capacitor 412. The other electrode of capacitor 412 is connected to drive line node 449. The foregoing is conventionally referred to as a 1T-1C architecture. Like the other systems, system 400 includes an array 401 of cells in four rows 470, 472, 474, and 476, and four columns, 460, 462, 464, and 466. However, the architecture of array system 400 is different from the conventional 1T-1C architecture in that node 449 is connected to drive line 422, which is sometimes called the "plate line" in conventional 1T-1C architecture, via set switch 414, which in this embodiment is a set transistor 414. One source-drain 434 of set transistor 414 is connected to node 449, and the other source-drain 433 is connected to drive line 422. In this embodiment, the SET signal is the same as the word line signal WL. For example, the gate 430 of set transistor 414 is connected to the word line 432. In this embodiment, reset switch 416 is also a transistor 416, and preamplifier 420 is a transistor 420, with the switch 416 and preamplifier 420 connected between bit line node 424 and cell/preamplifier node 428 as described above with respect to the other embodiments. In this embodiment, a sense amplifier, such as 480, is shown connected to each bit line, such as 425. Preferably, such a sense amplifier is associated with each bit line in the embodiments of FIGS. 1, 2, 4, and 5, though this was not shown for simplicity.

The operation of the array system 400 of FIG. 6 is the same as the operation of the system of FIG. 5, except either the DL signals become the BL signals, and vice-versa, or what is considered a digital "1" and "0" is reversed. In addition, instead of having a different signal DL for each column and all the set transistors on or off at the same time, there is one DL signal for all cells, and each set switch is independently controlled by the word line. This combination still allows one to control the set signal applied to each group of four cells, though in this case the four are a row of cells rather than a column. From the above, one skilled in the art can easily deduce the operation of the array system 400 of FIG. 6, so we will not repeat the operation here.

Figure 7:
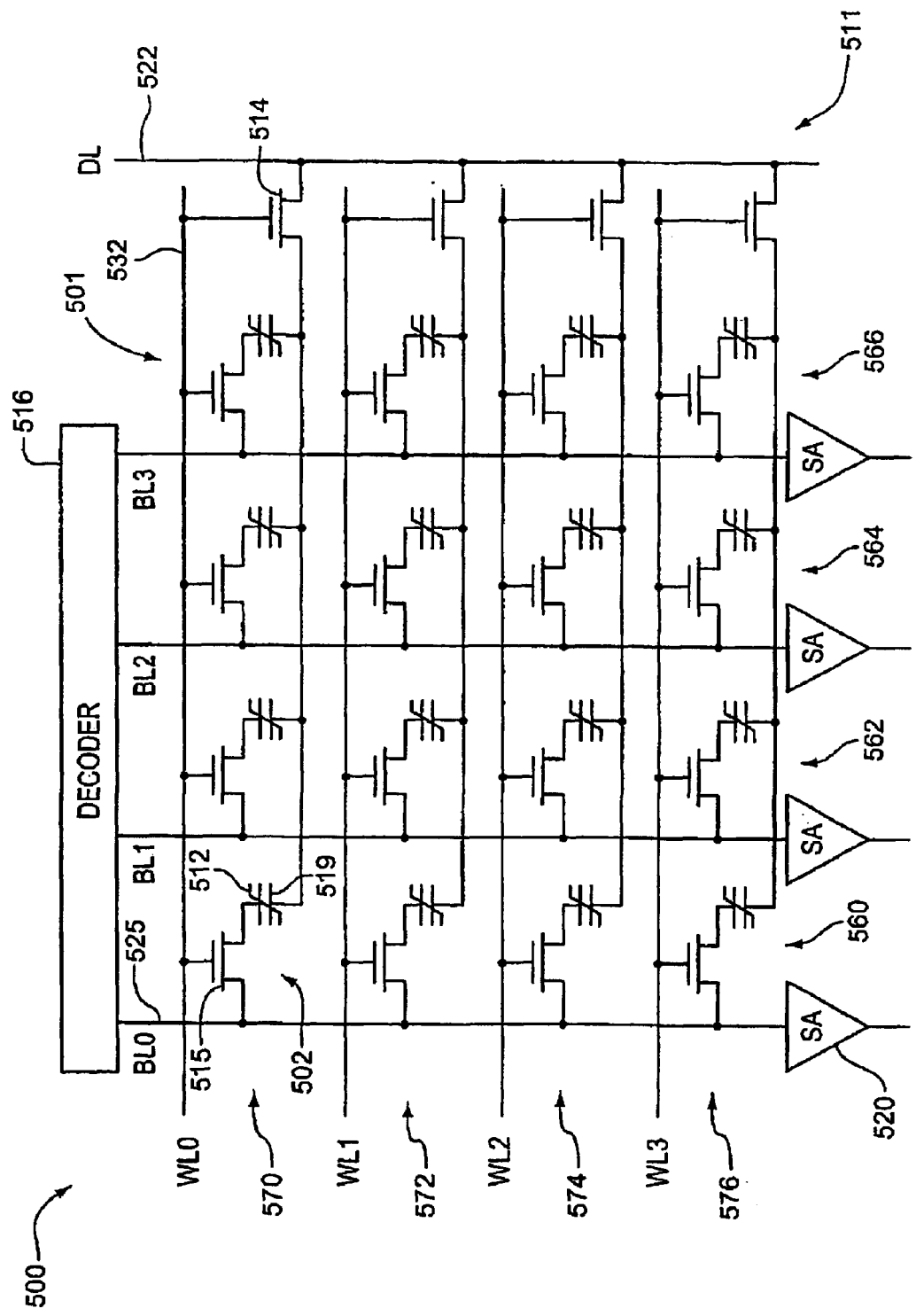
FIG. 7 is a an alternative embodiment of the memory of FIG. 6.

FIG. 7 is a 1T-1C cell implementation of a memory cell array system 500 in which the RST signal is applied via a decoder 516. In this embodiment, the preamplifier is the capacitance of bit line 525, which acts as a voltage divider in the architecture shown, which illustrates another possible variation. Except for these differences, the embodiment is the same as that of FIG. 6. That is, there is an array 501 of memory cells arranged in four rows 570, 572, 574, and 576 and four columns 560, 562, 564, and 566; each cell, such as 502, includes a transistor, such as 515, and a ferroelectric capacitor, such as 512 connected in series; there is a set switch, such as 514, connected between the drive or plate line 522 and one electrode, such as 519, or each capacitor 512, with one set switch 514 associated with each row of cells. The SET signal is applied through the word line 532, and reset switches in decoder 516 determine the voltage applied via the bit lines, such as 525, to the memory cells, such as 502. The operation of the array system 500 is the same as that of the system 400, except the operations of the reset switch and preamplifier are performed by different elements as noted above.

In this disclosure, the terms "row" and "column" are relative terms that are used to facilitate the disclosure. That is, conventionally, a row is a horizontal line or alignment and a column is a vertical line or alignment. However, the invention contemplates that in any array, rows can become columns and columns can become rows simply by viewing the array from a perspective that is rotated by 90 degrees, 270 degrees, etc. Thus, because a memory architecture is rotated by 90 degrees, 270 degrees, etc., from the invention described in the summary of the invention, the specification, or claims herein, but otherwise is the same, does not take it outside of the architectures contemplated by the invention.

Figure 8:
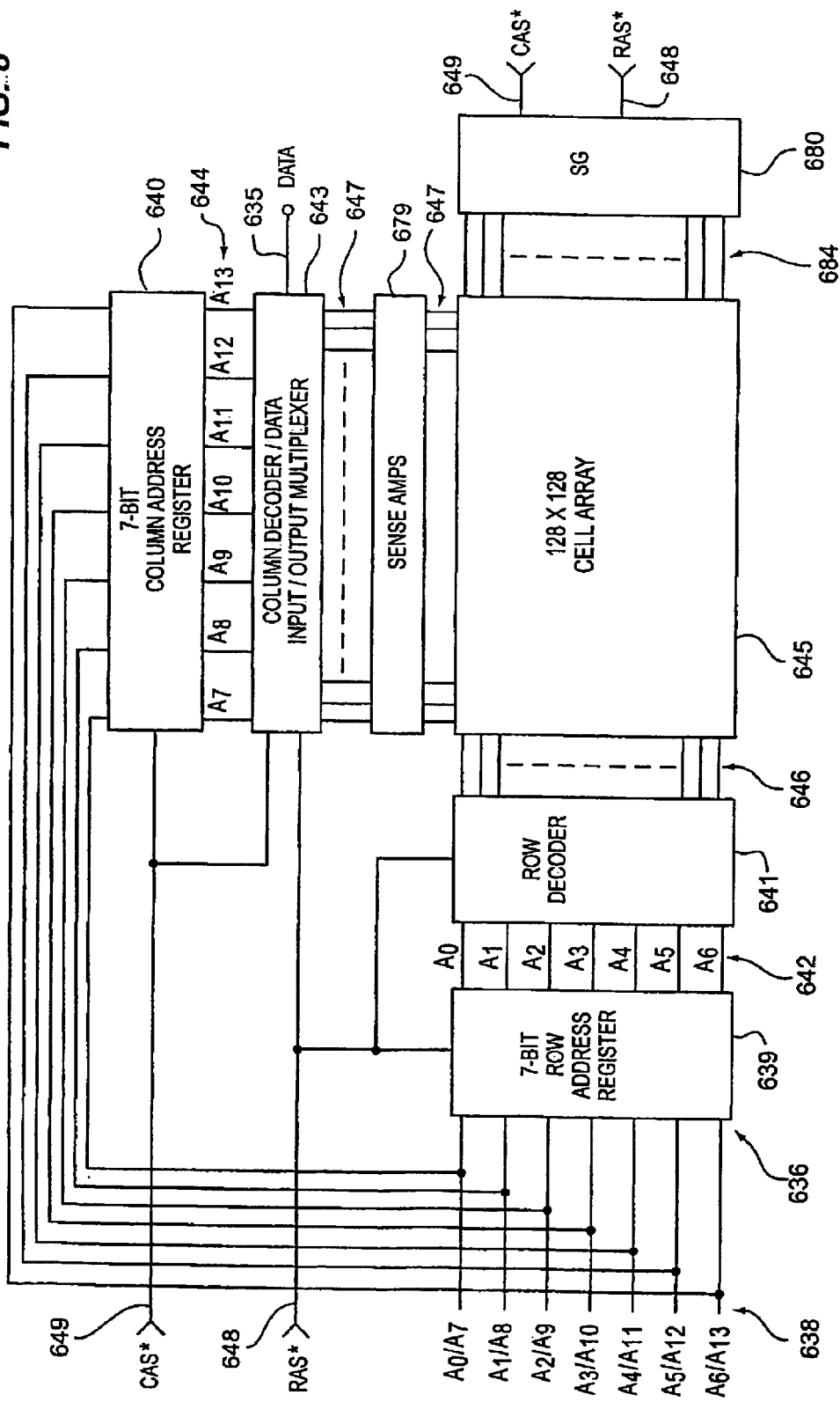
FIG. 8 is an electrical block diagram of a typical integrated circuit memory in which the memory array systems 200, 300, 400, and 500 according to the invention may be used.

FIG. 8 is a block diagram illustrating an exemplary integrated circuit memory 636 in which memory array systems, such as 200, 300, 400 and 500, according to the invention are utilized. For simplicity, the embodiment shown is for a 16K×1 FeRAM; however, the material may be utilized in a wide variety of sizes and types of memories. In the 16K embodiment shown, there are seven address input lines 638 which connect to a row address register 639 and a column address register 640. The row address register 639 is connected to row decoder 641 via seven lines 642, and the column address register 640 is connected to a column decoder/data input/output multiplexer 643 via seven lines 644. The row decoder 641 is connected to a 128×128 memory cell array 645 via 128 lines 646, and the column decoder/data input/output multiplexer 643 is connected to the sense amplifiers 679 and memory cell array 645 via 128 lines 647. A signal generator 680 is connected to the array 645 via up to 256 lines 684. As these lines are the shunt and plate lines discussed above, the number of lines depends on which embodiment of the invention discussed above is utilized. For example, if a common plate line is used for all cells and a separate shunt line is used for each row, then only 129 lines 684 would be required. A RAS* signal line 648 is connected to the row address register 639, row decoder 641, column decoder/data input/output multiplexer 643, and signal generator 680, while a CAS* signal line 649 is connected to the column address register 640, column decoder/data input/output multiplexer 643, and signal generator 680. (In the discussion herein, a * indicates the inverse of a signal.) An input/output data line 635 is connected to the column decoder/data input/output multiplexer 643. The memory 636 also includes a power source 699 that provides the nominal output voltage Vcc and other power to signal generator 680 and the rest of the system as required.

Memory cell array 645 contains 128×128=16,384 memory cells, which is conventionally designated as 16 K. These cells are ferroelectric element-based cells such as 202, 302, 402, 502, etc. The lines 646 are the word lines, such as 126, 326, 432, etc. The lines 647 are the bit lines, such as 325, 425, 525, etc.

The operation of the memory in FIG. 8 is as follows. Row address signals $A_0$ through $A_6$ and column address signals $A_7$ through $A_{13}$ placed on lines 638 are multiplexed by address registers 639, 640 utilizing the RAS* and CAS* signals, and passed to the row decoder 641 and column decoder/data input/output multiplexer 643, respectively. The row decoder 641 places the word line signals, such as the WLn signals discussed above, on one of the word lines 646; generally, a signal is placed on the word line of the cell that is addressed. The column decoder/data input/output multiplexer 643 either places the data signal which is input on line 635 on the one of the bit lines 647 corresponding to the column address, or outputs on the data line 635 the signal on the one of the bit lines 647 corresponding to the column address, depending on whether the function is a write or read function. This is the bit line signal, such as the BLm signal discussed above. As is known in the art, the read function is triggered when the RAS* signal precedes the CAS* signal, and the write function is triggered when the CAS* signal comes before the RAS* signal. As is well-known in the art, the sense amplifiers 679 are located along lines 647 to amplify the signals on the lines. The shunt line and plate line signals, such as SLn and CPn signals discussed above, are produced by signal generator 680 based on the CAS* and RAS* signals and an internal chip clock. Thus, signal generator 680 forms part of shunt systems 11, 101, and 701. In some memories, the signal generator 680 and row decoder 641 may be combined into a single signal generation unit. The circuitry of the row decoder 641 and signal generator 680 includes all circuitry required to produce the word line, shunt line, and plate line signals discussed above, including the boosted signals. This circuitry is known in the art of integrated circuit memory design, and will not be further discussed herein. Other logic required or useful to carry out the functions outlined above, as well as other known memory functions, is also included in the memory 636 but is not shown or discussed, as it is not directly applicable to the invention.

Figure 9:
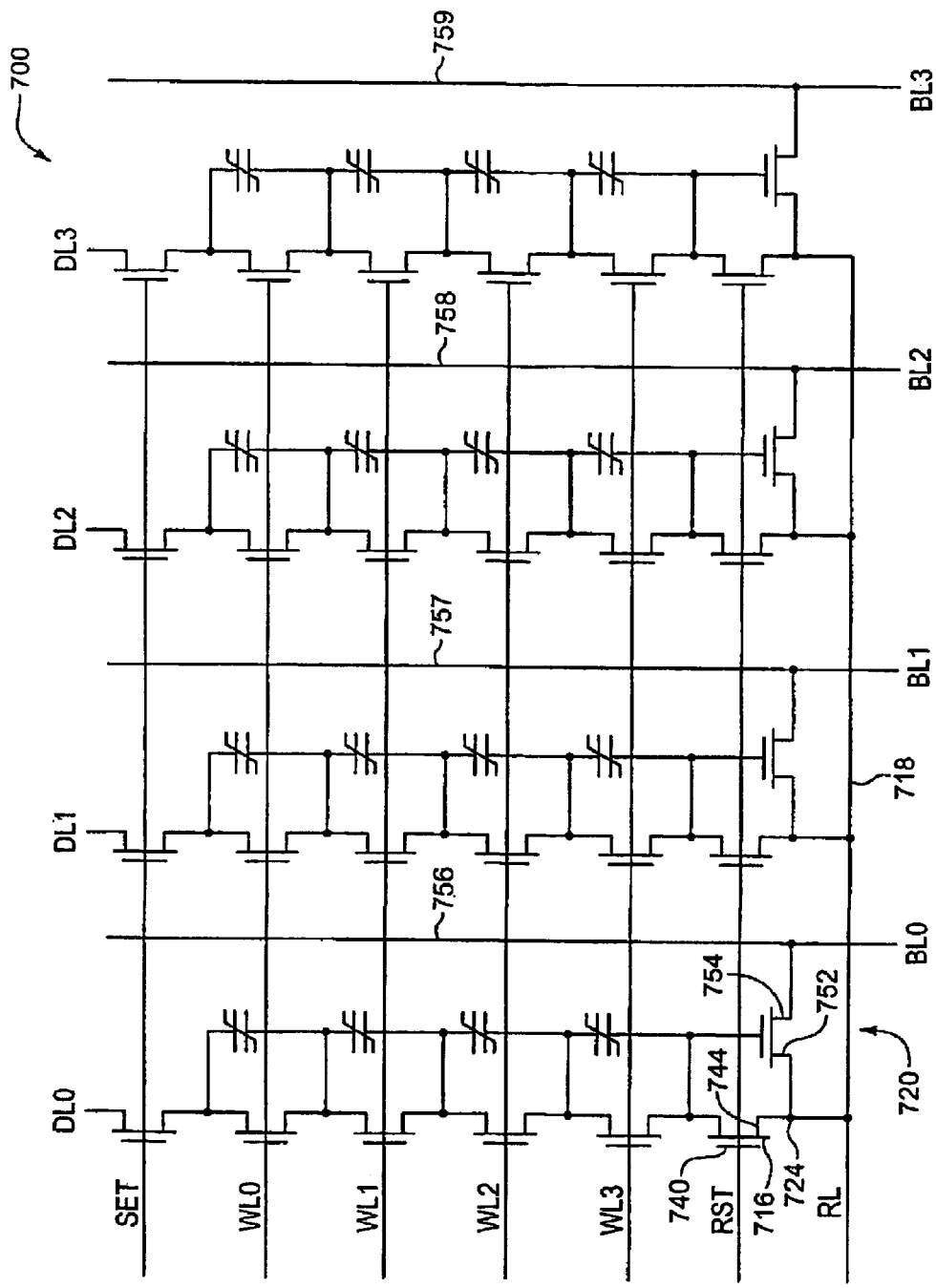
FIG. 9 is a circuit diagram of another alternative architecture according to the invention illustrating an alternative arrangement of the signals applied to the reset switch and the preamplifier.

FIG. 9 illustrates an alternative architecture of the memory of FIG. 4 in which the signals that operate the read and write functions are more separated. This embodiment is the same as the embodiment of FIG. 4, except for the following differences: an RL signal is provided on an additional line 718; the reset switch 740 has one source-drain 744 connected to line 718; preamplifier 720 has one source-drain connected to line 718 and the other source-drain 754 connected to bit line 756. Similarly line 718 is connected to each of the other reset switches, and each of the other rows of cells has an associated bit line 757, 758, and 759 that carries a signal BL1, BL2, and BL3, respectively, that is separate from the RL signal. The reading and writing functions in this embodiment are the same as those for the embodiment of FIG. 4, except for the separation of the RL and BL signals. The alternative architecture and signals shown in the embodiment of FIG. 9 can also be applied to the array systems of FIGS. 5, 6, and 7, or any other appropriate architecture with which the invention is used.

A feature of the invention is that the preamplifier or "read transistor", such as 42, enables the use of a read voltage much smaller than the prior art. The preamplifier 20, 42, 120, 320, 420 may take many forms other than a transistor; for example, it may be a capacitor that acts as a voltage divider, a diode, a series of gates, or other circuit or circuit element. The voltage applied to the circuit to read a cell, that is, the voltage applied to DL, is about 1.2 volts, and typically 0.5 to 2.0 volts. However, the read voltage that an individual cell sees, i.e., the voltage placed across the ferroelectric memory element when it is read, can be as little as 0.1 volts, and typically is about 0.1 to 0.5 volts, and most preferably about 0.1 to 0.3 volts. This voltage is generally one-half or less of the coercive voltage, and in some architectures is one-third or less of the coercive voltage, and most preferably is one-tenth to one-half of the coercive voltage. Since the probability of a disturb occurring decreases exponentially with the voltage applied, a voltage of one-tenth to one-half of the coercive voltage has negligible chance of causing a disturb. Moreover, since the read voltage is so small, its effect on neighboring cells to the one being read is so small as to not be calculable. These small read voltages also greatly reduce the rate of fatigue of an individual cell.

At the same time that the invention is useful in permitting very small disturbances to the memory, it is also useful in increasing the performance of conventional memories such as destructive read out memories. That is, the increased performance that permits detection of small signals also significantly increases the performance and robustness of a memory if it is employed in combination with memories that may have more significant chance of fatigue and disturb. Thus, it will be quite useful in applications in which fatigue and disturb are not a concern because of the small number of cycles, but absolute accuracy of data is critical.

Another feature of the invention is that the different data states are distinguished by different polarization slopes, rather than polarization differences. Thus, high polarization ferroelectrics are not required.

Another feature of the invention is that a single power supply can be used. That is, the read and write voltages are all small positive values. This significantly simplifies the peripheral circuitry required for the memory.

There have been described what are at present considered to be the preferred embodiments of the invention. It will be understood that the invention can be embodied in other specific forms without departing from its spirit or essential characteristics. For example, while the invention has been described in terms of transistor switches, other switches, such as diodes, may be used. Many other ferroelectric memory cell architectures can be used in combination with the addressing scheme shown, for example, those cell architectures disclosed in the references discussed in the Background of the Invention. Further, now that the possibility and advantages of addressing a ferroelectric memory cell utilizing a set switch and a reset switch in combination with a preamplifier has been disclosed, many modifications and variations of the principles disclosed may be devised. For example, in the embodiments of FIGS. 2, 4, 5, and 6, the source-drain, such as 254, connected to ground may be connected to the bit line, and the other source-drain, such as 252, and the reset switch, such as 116, may be connected to ground. The present embodiments are, therefore, to be considered as illustrative and not restrictive. The scope of the invention is indicated by the appended claims.

We claim:

1. A ferroelectric memory comprising a memory cell, and a circuit for reading and writing to said memory cell, wherein said circuit for reading and writing includes a drive line on which voltages for writing information to said memory cell and for reading information from said memory cell are placed, a bit line on which information to be read out of said memory cell is placed, a preamplifier having a preamplifier output providing a preamplifier output signal, said preamplifier connected between said memory cell and said bit line with said preamplifier output signal being applied to said bit line, a set switch connected between said drive line and said memory cell, and a reset switch connected to said memory cell.

2. A ferroelectric memory as in claim 1 wherein said preamplifier comprises a transistor having a gate and a pair of source-drains, and wherein said memory cell is connected to said gate, and one of said source-drains is connected to said bit line.

3. A ferroelectric memory as in claim 2 wherein said reset switch is a transistor having a pair of reset source-drains, with one of said reset source-drains connected to said memory cell and the other of said reset source-drains connected to one of said source-drains of said preamplifier transistor.

4. A ferroelectric memory as in claim 1 wherein said set switch is a transistor having a pair of set source-drains, with one of said set source-drains connected to said memory cell and the other of said set source-drains connected to said drive line.

5. A ferroelectric memory as in claim 1 wherein said reset switch is a transistor having a pair of reset source-drains, with one of said reset source-drains connected to said memory cell and the other of said reset source-drains connected to said bit line.

6. A ferroelectric memory as in claim wherein said reset switch is connected in parallel with said preamplifier between said memory cell and said bit line.

7. A ferroelectric memory comprising a plurality of memory cells and a circuit for reading and writing to said memory cells, wherein each of said memory cells comprise a memory cell transistor and a ferroelectric capacitor said memory cell transistor and ferroelectric capacitor connected in parallel, and wherein said circuit for reading and writing includes:

a plurality of read transistors, each of said read transistors including a gate, said gate connected to one of said memory cells;

a source of a reset signal; and a plurality of reset switches, each of said reset switches connected between said source of a reset signal and said gate of said read transistor.

8. A ferroelectric memory as in claim 7 wherein said reset switches are reset transistors, each of said reset transistors having a pair of reset source-drains, with one of said reset source-drains connected to said source of said reset signal and the other of said reset source-drains connected to said gate of one of said read transistors.

9. A ferroelectric memory comprising a plurality of memory cells and a circuit for reading and writing to said memory cells, wherein each of said memory cells comprise a memory cell transistor and a ferroelectric capacitor said memory cell transistor and ferroelectric capacitor connected in parallel, and wherein said circuit for reading and writing includes:

a source of a set signal; and a plurality of set switches, each of said set switches connected in series between said one of said memory cells and said source of a set signal.

10. A ferroelectric memory as in claim 9 wherein said set switches are set transistors, each of said set transistors having a pair of set source-drains, with one of said set source-drains connected to said source of said set signal and the other of said set source-drains connected to one of said memory cells.

11. A ferroelectric memory as in claim 1 wherein said memory is a non-destructive read out memory.

12. A ferroelectric memory as in claim 1 wherein said memory is a destructive read out memory.

* * * * *